(12) United States Patent
Salahuddin et al.

(10) Patent No.: US 11,742,011 B2
(45) Date of Patent: Aug. 29, 2023

(54) VOLTAGE-CONTROLLED GAIN-CELL MAGNETIC MEMORY

(71) Applicant: The Regents of the University of California, Oakland, CA (US)

(72) Inventors: Sayeef Salahuddin, Walnut Creek, CA (US); Shehrin Sayed, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 231 days.

(21) Appl. No.: 17/399,583

(22) Filed: Aug. 11, 2021

(65) Prior Publication Data

US 2023/0045804 A1 Feb. 16, 2023

(51) Int. Cl.
*G11C 11/00* (2006.01)
*G11C 11/16* (2006.01)
(Continued)

(52) U.S. Cl.
CPC ........ *G11C 11/161* (2013.01); *G11C 11/1655* (2013.01); *H10B 61/22* (2023.02); *H10N 50/80* (2023.02); *H10N 50/85* (2023.02)

(58) Field of Classification Search
CPC . G11C 13/0059; G11C 16/04; G11C 16/0408; G11C 16/0466; G11C 16/28; G11C 16/3459; G11C 2013/0071; G11C 2013/0088; G11C 2013/0092; G11C 2207/2281; G11C 2213/31; G11C 2213/32; G11C 2213/34; G11C 2213/75; G11C 2213/76; G11C 5/02; G11C 5/08; G11C 5/14; G11C 7/20; G11C 8/10; G11C 8/14;
(Continued)

(56) References Cited

U.S. PATENT DOCUMENTS 10,937,478 B2 * 3/2021 Bozdag ................ H10N 50/80
2011/0062538 A1 3/2011 Rizzo et al.
(Continued)

OTHER PUBLICATIONS

Sato, N. et al., "Two-terminal spin-orbit torque magnetoresistive random access memory," Nature Electronics, vol. 1, No. 9, Sep. 2018, pp. 508-511.
(Continued)

*Primary Examiner* — Thong Q Le
(74) *Attorney, Agent, or Firm* — Withrow & Terranova, P.L.L.C.

(57) ABSTRACT

The present disclosure relates to a magnetic memory structure with a voltage-controlled gain-cell configuration, which includes a memory resistive device, a first transistor connected in series with the memory resistive device, and a second transistor. The memory resistive device has a baseline resistance larger than 10 MΩ, and is eligible to exhibit a '1' state and a '0' state and exhibit a resistance change between the '1' state and the '0' state. The second transistor has a gate connected to a connection node of the first transistor and the memory resistive device. When the memory resistive device exhibits the '1' state, a gate voltage for the second transistor is smaller than a threshold voltage of the second transistor, and when the memory resistive device exhibits the '0' state, the gate voltage for the second transistor is larger than the threshold voltage of the second transistor.

20 Claims, 8 Drawing Sheets

Figure 1:
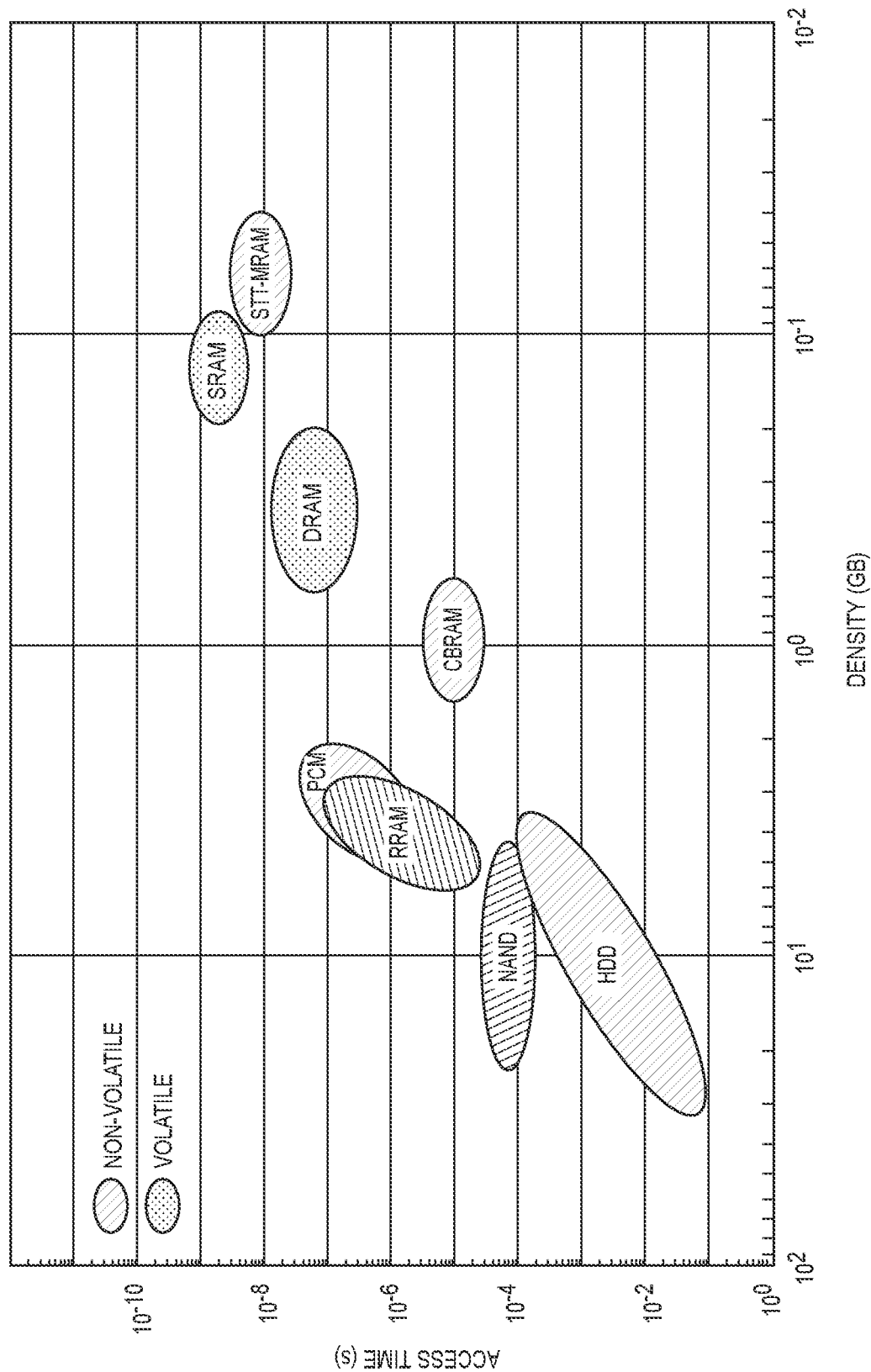

(51) Int. Cl.
  *H10B 61/00* (2023.01)
  *H10N 50/80* (2023.01)
  *H10N 50/85* (2023.01)

(58) Field of Classification Search
  CPC . G11C 11/404; G11C 11/4045; G11C 11/405;
       G11C 11/565; G11C 13/0009; G11C
       13/0033; G11C 16/0416; G11C 16/16;
       G11C 2013/0052; G11C 2207/2254;
       G11C 29/82; G11C 5/145; G11C 7/04;
       G11C 7/067; G11C 7/10; G11C 7/1096;
       G11C 7/18; G11C 7/22; G11C 8/06;
       G11C 8/16; G11C 8/18; H10B 61/22;
       H10B 63/80; H10B 63/30; H10B 61/00;
       H10B 63/00; H10B 63/24; H10B 63/84;
       H10B 10/00; H10B 12/00; H10B 12/09;
       H10B 12/50; H10B 41/20; H10B 43/20;
       H10B 43/40; H10B 61/10; H10B 12/48;
       H10B 41/41; H10B 41/42; H10B 63/20;
       H10B 63/34; H10N 50/80; H10N 50/10;
       H10N 50/01; H10N 50/85; H10N 70/231;
       H10N 70/826; H10N 70/8828; H10N
       70/011; H10N 70/801; H10N 70/8413;
       H10N 70/20; H10N 70/8833; H10N
       70/8836; H10N 70/882; H10N 70/329;
       H01F 10/329; H01L 21/02348; H01L
       27/0207; H01L 27/0688; H01L 21/76224;
       H01L 27/105; H01L 28/00
  USPC ............ 365/158, 171, 148, 163, 173, 210.1,
       365/189.16, 209, 230.06, 100, 107, 161,
       365/174, 185.13, 189.07, 189.11, 189.15,
       365/196, 200, 230.01, 230.02, 55, 63, 66
  See application file for complete search history.

(56) References Cited

U.S. PATENT DOCUMENTS

| | | |
|---|---|---|
| 2018/0166197 A1 | 6/2018 | Wang et al. |
| 2018/0240966 A1 | 8/2018 | Mihajlovic et al. |
| 2019/0252020 A1 | 8/2019 | Rios et al. |
| 2021/0012940 A1 | 1/2021 | Salahuddin et al. |

OTHER PUBLICATIONS

Sayed, S. et al., "Proposal of a Single Nano-Magnet Memory Device," IEEE Electron Device Letters, vol. 38, No. 12, Oct. 2017, pp. 1665-1668.
Sayed, S. et al., "Rectification in Spin-Orbit Materials Using Low-Energy-Barrier Magnets," Physical Review Applied, vol. 11, 2019, American Physical Society, 10 pages.
Sayed, S. et al., "Resonant Enhancement of Exchange Coupling for Voltage-Controlled Magnetic Switching," Physical Review Applied, vol. 14, Sep. 2020, American Physical Society, 18 pages.
Sayed, S. et al., "Unified Framework for Charge-Spin Interconversion in Spin-Orbit Materials," Physical Review Applied, vol. 15, No. 5, May 2021, American Physical Society, 21 pages.
Schleicher, F. et al., "Localized states in advanced dielectrics from the vantage of spin- and symmetry-polarized tunnelling across MgO," Nature Communications, vol. 5, 2014, Macmillan Publishers Limited, 9 pages.
Slonczewski, J.C., "Conductance and exchange coupling of two ferromagnets separated by a tunneling barrier," Physical Review B, vol. 39, No. 10, Apr. 1, 1989, The American Physical Society, pp. 6995-7002.
Slonczewski, J.C., "Letter to the Editor: Current-driven excitation of magnetic multilayers," Journal of Magnetism and Magnetic Materials, vol. 159, 1996, Elsevier, 7 pages.

Song, C. et al., "Recent progress in voltage control of magnetism: Materials,mechanisms, and performance," Progress in Materials Science, vol. 87, 2017, Elsevier Ltd., pp. 33-82.
Sun, J.Z., "Spin-current interaction with a monodomain magnetic body: A model study," Physical Review B, vol. 62, No. 1, Jul. 1, 2000, 9 pages.
Suzuki, R. et al., "Quantum size effect in an Fe quantum well detected by resonant tunneling carriers injected from a p-type Ge semiconductor electrode," Applied Physics Letters, vol. 112, 2018, AIP Publishing, 6 pages.
Tang, Y.-H. et al, Controlling the Nonequilibrium Interlayer Exchange Coupling in Asymmetric Magnetic Tunnel Junctions, Physical Review Letters, vol. 103, 2009, The American Physical Society, 4 pages.
Tao, B.S. et al., "Long-Range Phase Coherence in Double-Barrier Magnetic Tunnel Junctions with a Large Thick Metallic Quantum Well," Physical Review Letters, vol. 115, 2015, American Physical Society, 6 pages.
Toscano, S. et al., "Exchange-coupling between ferromagnets through a non-metallic amorphous spacer-layer," Journal of Magnetism and Magnetic Materials, vol. 114, 1992, Elsevier Science Publishers B.V., 5 pages.
Victora, R.H., "Composite Media for Perpendicular Magnetic Recording," IEEE Transactions on Magnetics, vol. 41, No. 2, Feb. 2005, IEEE, pp. 537-542.
Wang, S. et al., "Comparative Evaluation of Spin-Transfer-Torque and Magnetoelectric Random Access Memory," IEEE Journal on Emerging and Selected Topics in Circuits and Systems, vol. 6, Issue 2, Jun. 2016, IEEE, pp. 134-145.
Wang, L. et al., "Voltage-Controlled Magnetic Tunnel Junctions for Processing-In-Memory Implementation," IEEE Electron Device Letters, vol. 39, No. 3, Mar. 2018, IEEE, 4 pages.
Xu, C. et al., "Design Implications of Memristor-Based RRAM Cross-Point Structures," 2011 Design, Automation & Test in Europe, Mar. 14-18, 2011, Grenoble, France, IEEE, 6 pages.
Yakushiji, K. et al., "Very strong antiferromagnetic interlayer exchange coupling with iridium spacer layer for perpendicular magnetic tunnel junctions," Applied Physics Letters, vol. 110, 2017, API Publishing, 5 pages.
Yang, H.X. et al., "Effect of structural relaxation and oxidation conditions on interlayer exchange coupling in Fe|MgO Fe tunnel junctions," Applied Physics Letters, vol. 96, 2010, AIP Publishing, 4 pages.
Yang, H. et al., "Negative Tunneling Magnetoresistance by Canted Magnetization in MgO/NiO Tunnel Barriers," Physical Review Letters, vol. 106, No. 16, Apr. 2011, 17 pages.
Yoda, H., "26: MRAM Fundamentals and Devices," Handbook of Spintronics, 2016, Springer Science+Business Media, pp. 1031-1064.
You, C.-Y. et al., "Prediction of switching/rotation of the magnetization direction with applied voltage in a controllable interlayer exchange coupled system," Journal of Magnetism and Magnetic Materials, vol. 195, 1999, Elsevier, pp. 488-500.
You, C.-Y. et al., "Tunable interlayer exchange coupling energy by modification of Schottkybarrier potentials," Journal of Magnetism and Magnetic Materials, vol. 293, 2005, Elsevier B.V., pp. 774-781.
Yuasa, S. et al., "Giant room-temperature magnetoresistance in single-crystal Fe/MgO/Fe magnetic tunnel junctions," Nature Materials, vol. 3, Dec. 2004, Nature Publishing Group, pp. 868-871.
Yuasa, S. et al., "Spin-Polarized Resonant Tunneling in Magnetic Tunnel Junctions," Science, vol. 297, No. 5579, Jul. 2002, pp. 234-237.
Zhang, D. et al., "Bipolar electric-field switching of perpendicular magnetic tunnel junctions through voltage-controlled exchange coupling," arXiv:1912.10289 [physics.app-ph], Dec. 2019, 16 pages.
Zhao, W. et al., "Failure Analysis in Magnetic Tunnel Junction Nanopillar with Interfacial Perpendicular Magnetic Anisotropy," Materials, vol. 9, No. 41, MDPI, 17 pages.
Zhu, J.-G. et al., "Magnetic tunnel junctions," Materials Today, vol. 9, No. 11, Nov. 2006, pp. 36-45.
Non-Final Office Action for U.S. Appl. No. 16/510,343, dated Aug. 6, 2020, 9 pages.

(56) References Cited

OTHER PUBLICATIONS

Apalkov, D. et al., "Magnetoresistive Random Access Memory," Proceedings of the IEEE, vol. 104, No. 10, Oct. 2016, IEEE, pp. 1796-1830.

Author Unknown, "Predictive Technology Model (PTM)," 2007, last updated Jun. 2011, Nanoscale Integration and Modeling (NIMO) Group, ASU, http://ptm.asu.edu/, 1 page.

Bahn, H. et al., "Implications of NVM Based Storage on Memory Subsystem Management," Applied Sciences, vol. 10, No. 3, Feb. 2020, MDPI, 18 pages.

Bauer, U. et al., "Magneto-ionic control of interfacial magnetism," Nature Materials, vol. 14, Feb. 2015, pp. 174-181.

Bedeschi, F. et al., "An 8Mb Demonstrator for High-Density 1.8V Phase-Change Memories," 2004 Symposium on VLSI Circuits Digest of Technical Papers, Jun. 17-19, 2004, Honolulu, HI, USA, IEEE, pp. 442-445.

Bennett, W.R. et al., "Concurrent Enhancement of Kerr Rotation and Antiferromagnetic Coupling in Epitaxial Fe/Cu/Fe Structures," Physical Review Letters, vol. 65, No. 25, Dec. 17, 1990, pp. 3169-3172.

Berger, L., "Emission of spin waves by a magnetic multilayer traversed by a current," Physical Review B, vol. 54, No. 13, Oct. 1, 1996, 6 pages.

Bhowmik, D. et al., "Possible Route to Low Current, High Speed, Dynamic Switching in a Perpendicular Anisotropy CoFeB_13 MgO Junction Using Spin Hall Effect Of Ta," 2012 International Electron Devices Meeting, Dec. 10-13, 2012, San Francisco, CA, IEEE, 4 pages.

Bi, C. et al., "Reversible Control of Co Magnetism by Voltage-Induced Oxidation," Physical Review Letters, vol. 113, Dec. 2014, The American Physical Society, 5 pages.

Brookes, N.B. et al., "Magnetic Interface States and Finite-Size Effects," Physical Review Letters, vol. 67, No. 3, Jul. 15, 1991, pp. 354-357.

Brubaker, M. et al., "Oscillatory interlayer magnetic coupling of sputtered Fe/Mo superlattices," Applied Physics Letters, vol. 58, No. 20, May 20, 1991, American Institute of Physics, pp. 2306-2308.

Bruno, P. et al., "Theory of interlayer magnetic coupling," Physical Review B, vol. 52, No. 1, Jul. 1995, The American Physical Society, 30 pages.

Camsari, K. Y. et al., "Ultrafast Spin-Transfer-Torque Switching of Synthetic Ferrimagnets," IEEE Magnetics Letters, vol. 7, 2016, IEEE, 5 pages.

Chang, L.L. et al., "Resonant tunneling in semiconductor double barriers," Applied Physics Letters, vol. 24, 2003, AIP Publishing, 4 pages.

Chappert, C. et al., "The emergence of spin electronics in data storage," Nature Materials, vol. 6, Nov. 2007, Nature Publishing Group, pp. 813-823.

Chatterjee, J. et al., "Novel multifunctional RKKY coupling layer for ultrathin perpendicular synthetic antiferromagnet," Scientific Reports, vol. 8, 2018, 9 pages.

Cherifi, R.O. et al., "Electric-field control of magnetic order above room temperature," Nature Materials, vol. 13, Apr. 2014, Macmillan Publishers Limited, pp. 345-351.

Chiang, Y.F. et al., "Oxidation-induced biquadratic coupling in Co/Fe/MgO/Fe(001)," Physical Review B, vol. 79, 2009, The American Physical Society, 5 pages.

Datta, D. et al., "Voltage Asymmetry of Spin-Transfer Torques," IEEE Transactions on Nanotechnology, vol. 11, No. 2, Mar. 2012, pp. 261-272.

Datta, S., "Electronic Transport in Mesoscopic Systems," Cambridge University Press, 1995, 393 pages.

Dc, M. et al., "Room-temperature high spin-orbit torque due to quantum confinement in sputtered BixSe(1-x) films," Nature Materials, vol. 17, Sep. 2018, pp. 800-807.

Dinia, A. et al., "Interfacial polarisation effect on the interlayer couplings in Co/Rh sandwiches," The European Physical Journal B, vol. 5, 1998, Springer-Verlag, 12 pages.

Fan, X. et al., "Reversible Switching of Interlayer Exchange Coupling through Atomically Thin VO2 via Electronic State Modulation," Matter, vol. 2, Issue 6, Jun. 3, 2020, Elsevier Inc., pp. 1582-1593.

Faure-Vincent, J. et al., "Interlayer Magnetic Coupling Interactions of Two Ferromagnetic Layers by Spin Polarized Tunneling," Physical Review Letters, vol. 89, No. 10, Sep. 2, 2002, The American Physical Society, 4 pages.

Fong, X. et al., "Spin-Transfer Torque Memories: Devices, Circuits, and Systems," Proceedings of the IEEE, vol. 104, No. 7, Jul. 2016, IEEE, pp. 1449-1488.

Fullerton, E. et al., "Oscillatory interlayer coupling and giant magnetoresistance in epitaxial Fe/Cr(2&g) and (100) superlattices," Physical Review B, vol. 48, No. 21, Dec. 1, 1993, The American Physical Society, pp. 15755-15763.

Haney, P. et al., "Bias dependence of magnetic exchange interactions: Application to interlayer exchange coupling in spin valves," Physical Review B, vol. 79, 2009, 9 pages.

Heron, J.T. et al., "Deterministic switching of ferromagnetism at room temperature using an electric field," Nature, vol. 516, Dec. 2014, Macmillan Publishers Limited, 15 pages.

Hong, J. et al., "The Physics of Spin-Transfer Torque Switching in Magnetic Tunneling Junctions in Sub-10 nm Size Range," IEEE Transactions on Magnetics, vol. 52, No. 7, Jul. 2016, IEEE, 4 pages.

Jaiswal, A. et al., "Energy-Efficient Memory Using Magneto-Electric Switching of Ferromagnets," IEEE Magnetics Letters, vol. 8, Jun. 2017, IEEE, 5 pages.

Kang, W. et al., "Voltage-controlled MRAM for working memory: Perspectives and challenges," Design, Automation & Test in Europe Conference & Exhibition, Mar. 27-31, 2017, Lausanne, Switzerland, IEEE, pp. 542-547.

Kawahara, T. et al., "Spin-transfer torque RAM technology: Review and prospect," Microelectronics Reliability, vol. 52, 2012, Elsevier Ltd., pp. 613-627.

Kubota, H. et al., "Quantitative measurement of voltage dependence of spin-transfer torque in mgo-based magnetic tunnel junctions," Nature Physics, vol. 4, Nov. 2007, Nature Publishing Group, pp. 37-41.

Li, X.-X. et al., "Oscillatory antiferromagnetic interlayer coupling in Co/Pt multilayer with perpendicular anisotropy," Solid State Communications, vol. 148, 2008, Elsevier Ltd., pp. 209-212.

Liao, Y.-C. et al., "Benchmarking and optimization of spintronic memory arrays," IEEE Journal on Exploratory Solid-State Computational Devices and Circuits, vol. 6, No. 1, Jun. 2020, IEEE, pp. 9-17.

Liu, L. et al., "Spin-Torque Switching with the Giant Spin Hall Effect of Tantalum," Science, vol. 336, No. 6081, May 4, 2012, pp. 555-558.

Liu, R.S. et al., "CoFe alloy as middle layer for strong spin dependent quantum well resonant tunneling in MgO double barrier magnetic tunnel junctions," Physical Review B, vol. 87, 2013, American Physical Society, 5 pages.

Liu, Z.Y. et al., "Oscillatory Interlayer Exchange Coupling and Its Temperature Dependence in [Pt/Co]3/NiO/[Co/Pt]3 Multilayers with Perpendicular Anisotropy," Physical Review Letters, vol. 91, No. 3, Jul. 18, 2003, The American Physical Society, 4 pages.

Marrazzo, A. et al., "Locality of the anomalous Hall conductivity," Physical Review B, vol. 95, No. 12, 2017, American Physical Society, 4 pages.

Mathon, J. et al., "Theory of oscillatory exchange in magnetic multilayers:effect of partial confinement and band mismatch," Journal of Magnetism and Magnetic Materials, vol. 121, 1993, Elsevier Science Publishers B.V., pp. 242-247.

Matsukura, F. et al., "Control of magnetism by electric fields," Nature Nanotechnology, vol. 10, Mar. 2015, MacMillan Publishers Limited, pp. 209-220.

Mazaletskiy, L. et al., "Problems of the experimental implementation of MTJ," Journal of Physics Conference Series, vol. 643, No. 1, Nov. 2015, IOP Publishing, 4 pages.

Newhouse-Illige, T. et al., "Voltage-controlled interlayer coupling in perpendicularly magnetized magnetic tunnel junctions," Nature Communications, vol. 8, Article 15232, May 2017, 7 pages.

(56) References Cited

OTHER PUBLICATIONS

Ortega, J.E. et al., "Quantum-well states and magnetic coupling between ferromagnets through a noble-metal layer," Physical Review B, vol. 47, No. 3, Jan. 15, 1993, The American Physical Society, 14 pages.
Parkin, S.S.P., "Systematic Variation of the Strength and Oscillation Period of Indirect Magnetic Exchange Coupling through the 3d, 4d, and 5d Transition Metals," Physical Review Letters, vol. 67, No. 25, Dec. 16, 1991, The American Physical Society, 4 pages.
Perrissin, N. et al., "Highly thermally stable sub-20nm magnetic random-access memory based on perpendicular shape anisotropy," Nanoscale, vol. 10, No. 25, Mar. 2018, 15 pages.
Petroff, F. et al., "Oscillatory interlayer exchange and magnetoresistance in Fe/Cu multilayers," Physical Review B, vol. 44, No. 10, Sep. 1, 1991, The American Physical Society, pp. 5355-5357.
Rampe, A. et al., "Induced spin polarization and interlayer exchange coupling of the systems Rh/Co(0001) and Ru/Co (0001)," Physical Review B, vol. 51, No. 5, Feb. 1995, The American Physical Society, 4 pages.
Ryu, J.-W. et al., "A Reliable 2T2MTJ Nonvolatile Static Gain Cell STT-MRAM With Self-Referencing Sensing Circuits tor Embedded Memory Application," IEEE Transactions on Magnetics, vol. 52, No. 4, Apr. 2016, 10 pages.
Salahuddin, S. et al., "The era of hyper-scaling in electronics," Nature Electronics, vol. 1, Aug. 2018, pp. 442-450.

\* cited by examiner

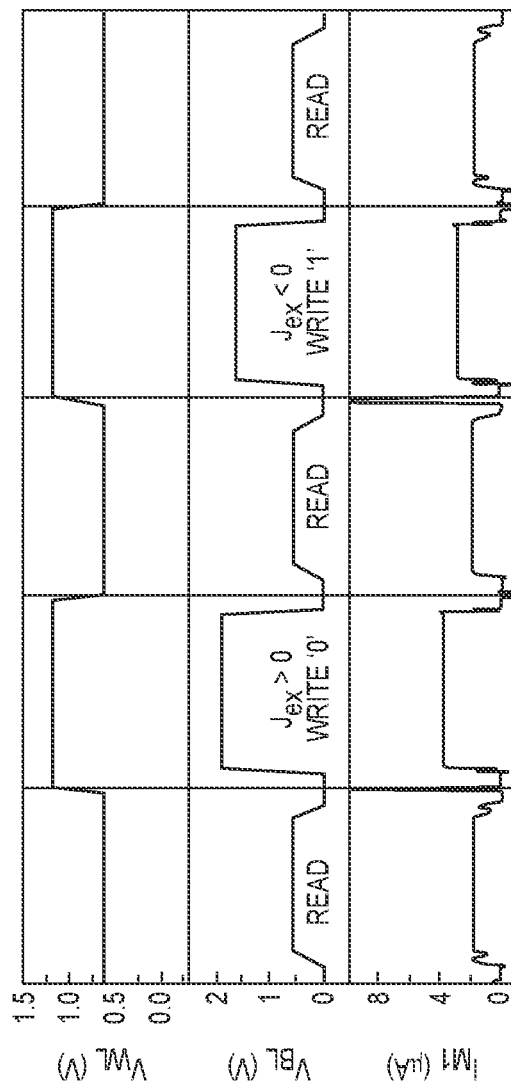

VOLTAGE-CONTROLLED GAIN-CELL MAGNETIC MEMORY

GOVERNMENT SUPPORT

This invention was made with government funds under Agreement No. HR0011-18-3-0004 awarded by The Defense Advanced Research Projects Agency (DARPA). The U.S. Government has certain rights in this invention.

FIELD OF THE DISCLOSURE

The technology of the disclosure relates generally to electronic data storage and, more particularly, to a magnetic memory structure with a voltage-controlled gain-cell configuration.

BACKGROUND

Many different technologies are used to create electronic data storage ("memory") elements for storing programs and data in binary form in electronic devices. Memory element technologies are characterized by their access times (i.e., read and write delay), density, power utilization, and volatility in the absence of power. Technologies that excel in one or more of these characteristics are typically inferior in other respects. As a result, different memory element technologies are used for different purposes, according to their particular characteristics. FIG. 1 illustrates comparisons of read/write speed and density of various electronic data storage technologies. As shown in FIG. 1, static random access memory (RAM) (SRAM) technology can have a fast read/write speed, which is beneficial for use with a high-speed processor, but the high speed is obtained at the expense of a large area needed for the multiple transistors of which each SRAM cell is comprised, as well as the other components of an SRAM array. Dynamic RAM (DRAM) is more dense, but not as fast as high-speed SRAM. Unfortunately, both SRAM and DRAM elements are volatile, meaning that the data stored therein is lost when power is removed. In contrast, a high-density non-volatile memory (NVM) such as NAND has been developed for long-term storage, but the long access time of NVM storage is too slow for use in high-speed processor applications. Spin-Transfer Torque (STT) magnetic RAM (MRAM) is an example of memory that can have a much faster read/write speed (i.e., short access latency) than NAND, and is non-volatile, so no power is required to preserve the data stored therein. However, the STT-MRAM has a low density, which requires a large area for implementation.

Figure 2:
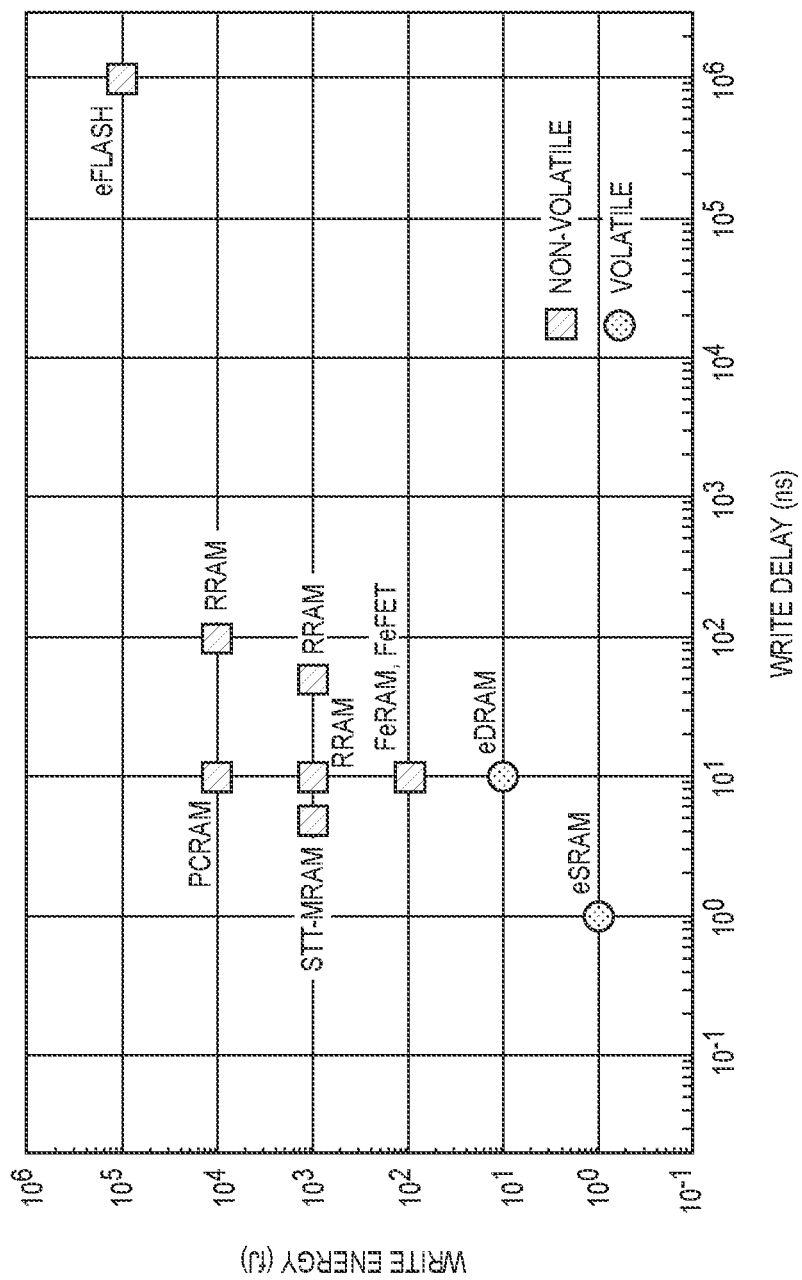

FIG. 2 illustrates comparisons of write energy consumption and write latency of existing MRAM technologies. As shown in FIG. 2, embedded SRAM (eSRAM) can have a fast write speed with a small amount of energy consumption. However, eSRAM elements are volatile and will lose data stored therein when power is removed. In addition, although the STT-MRAM can achieve a relatively fast write speed and is non-volatile, the STT-MRAM requires high current density for switching a magnetization direction of the free magnetic layer, causing high power consumption and less bit density than is preferred for mobile devices.

Accordingly, there is an object of the present disclosure to provide an improved non-volatile memory structure, which can achieve high speed read/write speed with high-density, without sacrificing power consumption. In addition, there is also a need to implement the non-volatile memory structure in a cost effective and controllable manner.

SUMMARY

The present disclosure relates to a magnetic memory structure with a voltage-controlled gain-cell configuration. The disclosed magnetic memory structure includes a two-terminal memory resistive device with a first terminal connected to a bit line (BL), a first transistor connected in series between a second terminal of the memory resistive device and a first source line (SL), and a second transistor. The memory resistive device has a baseline resistance larger than 10 MΩ, and is eligible to exhibit a '1' state and a '0' state and exhibit a resistance change between the '1' state and the '0' state. The second transistor has a gate connected to a connection node of the first transistor and the memory resistive device, a drain connected to a bias voltage power, and a source connected to a second SL. Herein, when the memory resistive device exhibits the '1' state, a gate voltage at the gate of the second transistor is smaller than a threshold voltage of the second transistor, and when the memory resistive device exhibits the '0' state, the gate voltage at the gate of the second transistor is larger than the threshold voltage of the second transistor.

In one embodiment of the magnetic memory structure, the memory resistive device is configured to switch between the '1' state and a '0' state by applying voltage pulses, which have different amplitudes with a same polarity.

In one embodiment of the magnetic memory structure, corresponding to the '0' state and the '1' state, a current flowing through the second transistor changes between $10^3$ times and $10^9$ times in amplitude.

In one embodiment of the magnetic memory structure, the first SL and the second SL are connected to ground.

According to one embodiment, the magnetic memory structure further includes a resistor, which is connected in series between the drain of the second transistor and the bias voltage power.

In one embodiment of the magnetic memory structure, each of the first transistor and the second transistor is implemented with one of bulk complementary metal-oxide-semiconductor (CMOS), silicon-on-insulator (SOI) technologies, Fin field-effect transistors (FETs), and negative-capacitance (NC) FETs.

In one embodiment of the magnetic memory structure, a magnetoresistance (MR) change of the memory resistive device is between 20%-40% between the '0' state and the '1' state.

In one embodiment of the magnetic memory structure, the memory resistive device is a resonant-exchange-controlled (REC) magnetic tunnel junction (MTJ). The memory resistive device includes a fixed magnetic layer, a free magnetic layer, and a resonant tunnel barrier disposed between the fixed magnetic layer and the free magnetic layer. Herein, when the memory resistive device exhibits the '1' state, a magnetization direction of the free magnetic layer relative to a magnetization direction of the fixed magnetic layer is parallel, and when the memory resistive device exhibits the '0' state, a magnetization direction of the free magnetic layer relative to a magnetization direction of the fixed magnetic layer is antiparallel.

In one embodiment of the magnetic memory structure, the magnetization direction of the free magnetic layer relative to the magnetization direction of the fixed magnetic layer is parallel in response to a first BL voltage applied to the BL. The magnetization direction of the free magnetic layer relative to a magnetization direction of the fixed magnetic layer is antiparallel in response to a second BL voltage applied to the BL. The first BL voltage and the second BL voltage have different amplitudes and a same polarity.

In one embodiment of the magnetic memory structure, the first BL voltage and the second BL voltage change interlayer exchange coupling (IEC) between the fixed magnetic layer and the free magnetic layer of the REC MTJ above a threshold, at which the magnetization direction of the free magnetic layer is determined by the magnetization direction of the fixed magnetic layer.

In one embodiment of the magnetic memory structure, the fixed magnetic layer and the free magnetic layer each comprises one of iron (Fe), cobalt (Co), nickel (Ni), lanthanum strontium manganite (LSMO), cobalt iron boron (CoFeB), and cobalt iron (CoFe).

In one embodiment of the magnetic memory structure, the fixed magnetic layer has a thickness in a range of 5 nm to 100 nm, and the free magnetic layer has a thickness in a range of 1 nm to 3 nm.

In one embodiment of the magnetic memory structure, the resonant tunnel barrier includes a spacer layer disposed between the fixed magnetic layer and the free magnetic layer, a first oxide layer disposed between the fixed magnetic layer and the spacer layer, and a second oxide layer disposed between the spacer layer and the free magnetic layer.

In one embodiment of the magnetic memory structure, the spacer layer comprises one of ruthenium (Ru), gold (Au), iridium (Ir), rhodium (Rh), copper (Cu), chromium (Cr), palladium (Pd), molybdenum (Mo), vanadium (V), tantalum (Ta), tungsten (W), platinum (Pt), nickel oxide (NiO), and iron silicon (FeSi). The first oxide layer and the second oxide layer each comprise one of magnesium oxide (MgO), magnesium zinc oxide (MgZnO), aluminum monoxide (AlOx), iron oxide ($Fe_2O_3$), titanium oxide ($TiO_2$), zinc oxide (ZnO), niobium oxide ($Nb_2O_5$), rhodium oxide ($Rh_2O_3$), tantalum oxide ($Ta_2O_3$), vanadium oxide ($V_2O_5$), aluminum oxide ($Al_2O_3$), and hafnium oxide ($HfO_2$).

In one embodiment of the magnetic memory structure, the first oxide layer and the second oxide layer each has a thickness in a range of 0.5 nm to 3 nm, and the spacer layer has a thickness in a range of 0.1 nm to 4 nm.

In one embodiment of the magnetic memory structure, the memory resistive device is a resonant-exchange-controlled (REC) magnetic tunnel junction (MTJ). The memory resistive device includes a fixed magnetic layer, a free magnetic layer, and a resonant tunnel barrier providing a quantum well between the fixed magnetic layer and the free magnetic layer. Herein, when the memory resistive device exhibits the '1' state, an interlayer exchange coupling (IEC) in the resonant tunnel barrier achieves a first IEC peak. When the memory resistive device exhibits the '0' state, the IEC in the resonant tunnel barrier achieves a second IEC peak. The first IEC peak and the second IEC peak have different polarities.

In one embodiment of the magnetic memory structure, the first IEC peak is achieved in response to a first BL voltage applied to the BL, the second IEC peak is achieved in response to a second BL voltage applied to the BL, and the first BL voltage and the second BL voltage have different magnitudes and a same polarity.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 provides a graph comparing read/write speed and density of various electronic data storage technologies.

FIG. 2 provides a graph comparing energy consumption and write latency of existing magnetic random access memory (MRAM) technologies.

Figure 3:
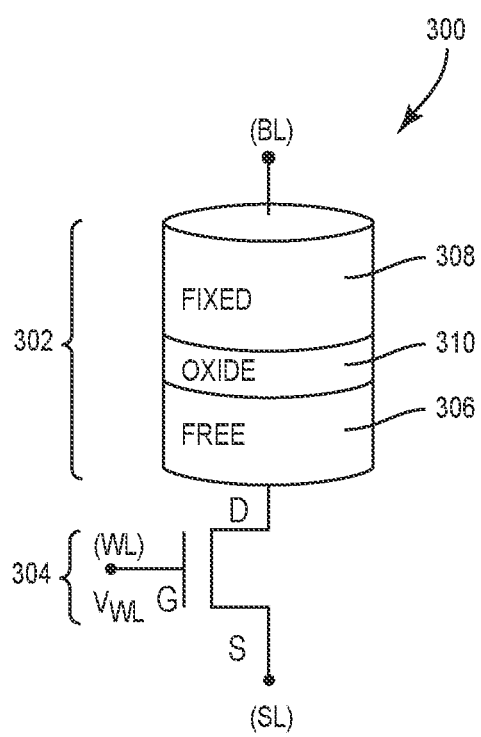

FIG. 3 provides a schematic diagram of a magnetic memory structure that employs current induced spin-transfer torque (STT).

Figure 4:
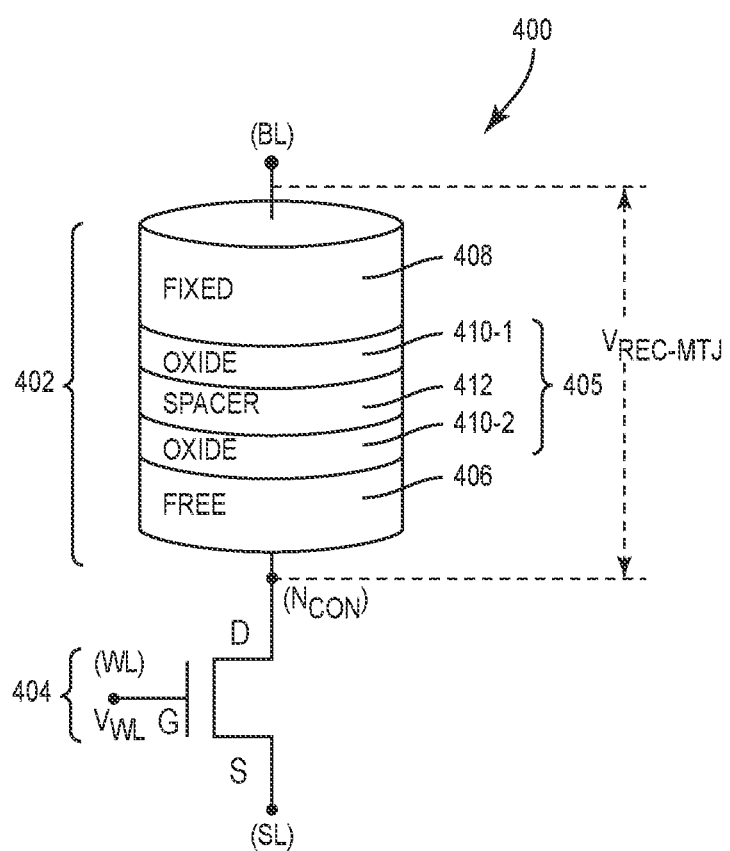

FIG. 4 provides a schematic diagram of a magnetic memory structure including a resonant-exchange-controlled (REC) magnetic tunnel junction (MTJ).

FIGS. 5A-5D provide characteristics of the REC-MTJ illustrated in FIG. 4.

Figure 6:
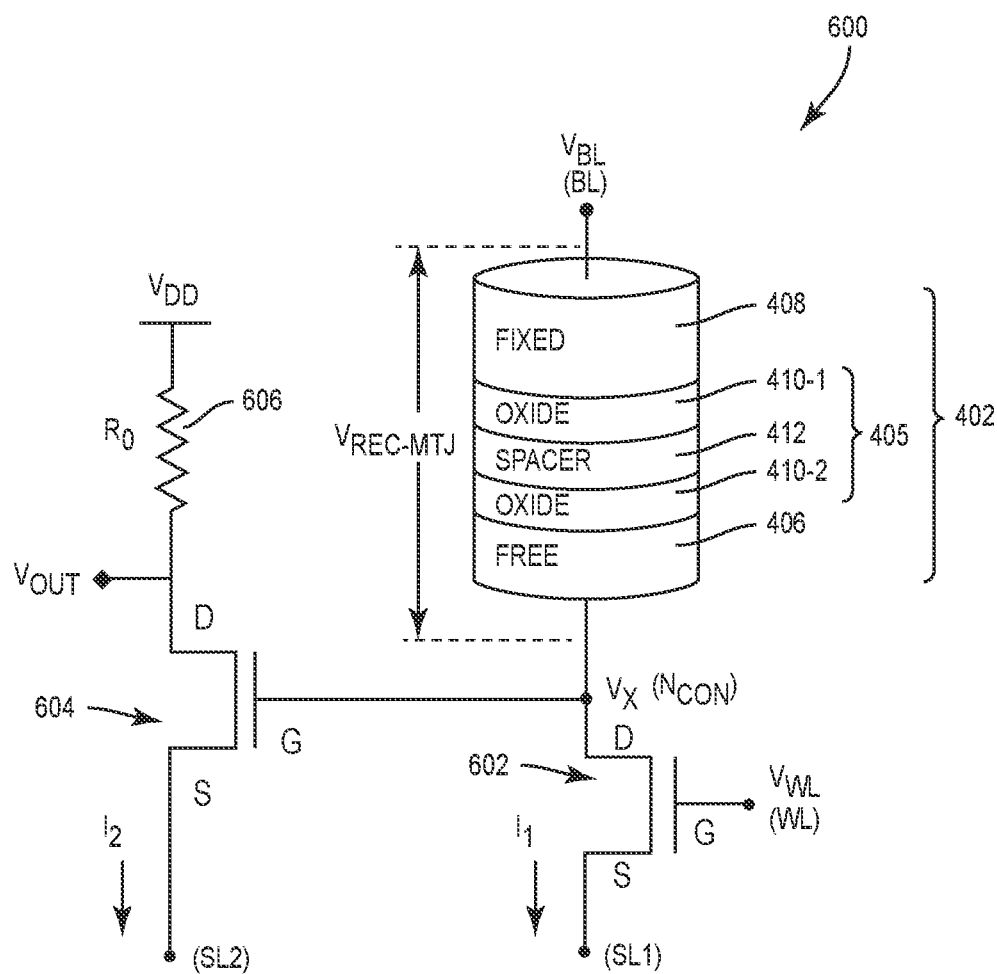

FIG. 6 provides a schematic diagram of an exemplary magnetic memory structure with a voltage-controlled gain-cell configuration according to one embodiment of the present disclosure.

FIGS. 7A-7F provide operation simulations of the exemplary magnetic memory structure illustrated in FIG. 6.

Figure 8A:
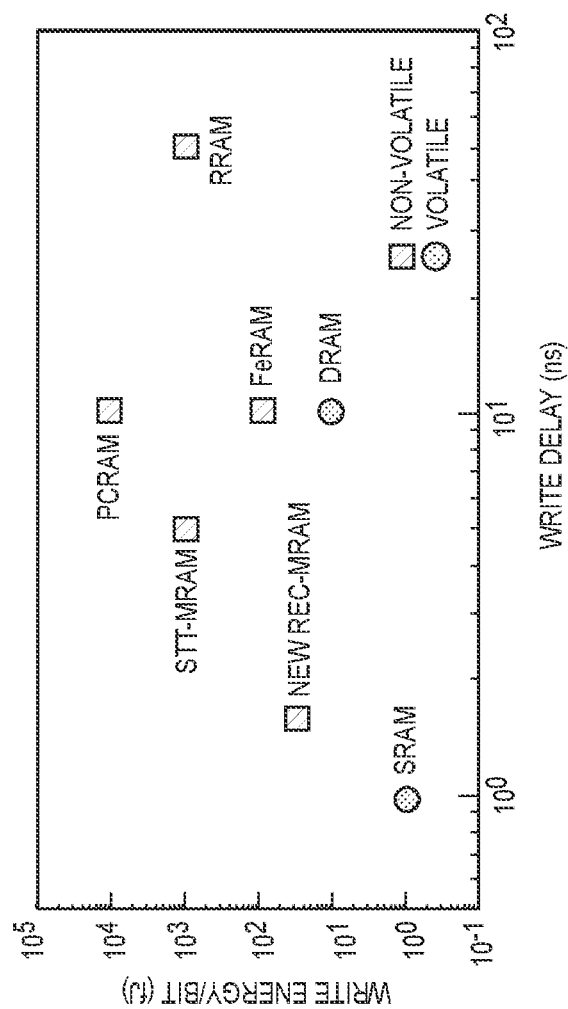
Figure 8B:
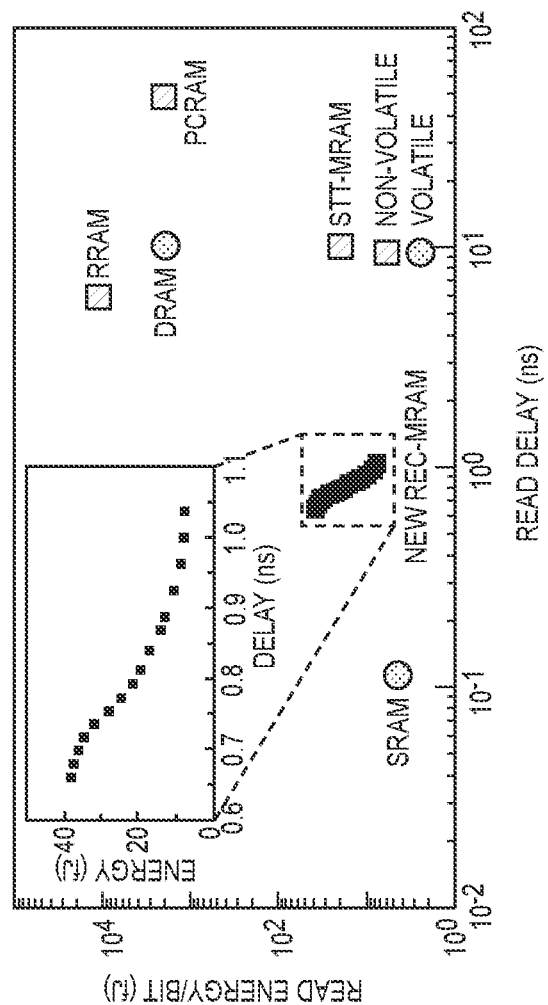

FIGS. 8A and 8B illustrate comparisons of energy consumption and latency of the exemplary magnetic memory structure illustrated in FIG. 6 with existing MRAM technologies.

It will be understood that for clear illustrations, FIGS. 1-8B may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Electronic data stored in a magnetic memory structure can remain stable for a long period of time in the absence of a power source, unlike static random access memory (RAM) (SRAM) and dynamic RAM (DRAM) which lose data when power is removed. Existing magnetic RAM (MRAM) technologies employing current-induced spin-transfer torque (STT) or spin-orbit toque (SOT), however, require a large current density for switching a magnetization direction, which limits advancements in energy efficiency and bit density.

FIG. 3 provides a schematic diagram of a conventional STT-MRAM 300 that includes a magnetic tunnel junction (MTJ) 302 as a bit storage unit and a controlled transistor 304 to select the bit. The MTJ 302 employs STT to control a magnetization direction of a free magnetic layer 306 relative to a magnetization direction of a fixed magnetic layer 308 that is separated from the free magnetic layer 306 by an oxide layer 310. The magnetization direction of the free magnetic layer 306 can be set parallel to the magnetization direction of the fixed magnetic layer 308 by a current through the oxide layer 310 in a first direction (e.g., from the fixed magnetic layer 308 to the free magnetic layer 306). The magnetization direction of the free magnetic layer 306 can be set antiparallel to a direction of the fixed magnetic layer 308 by reversing the direction of the current (e.g., from the free magnetic layer 306 to the fixed magnetic layer 308).

The MTJ 302 is connected in series with the controlled transistor 304. A gate of the controlled transistor 304 is connected to a word line (WL), an open terminal of the MTJ 302 (i.e., a terminal at the fixed magnetic layer 308) is connected to a bit line (BL), and an open terminal of the controlled transistor 304 (i.e., a terminal at a source of the controlled transistor 304) is connected to a source line (SL). A WL voltage $V_{WL}$ is applied at the WL to turn on the controlled transistor 304 and select the bit, if the WL voltage $V_{WL}$ is larger than a threshold voltage $V_{TH}$ of the controlled transistor 304.

To write information '0' into the MTJ 302, a write voltage is applied at the BL, while the SL is at a relatively lower voltage (e.g., 0V). As such, a write current flows from the MTJ 302 to the controlled transistor 304. Usually, the write voltage is provided such that the controlled transistor 304 is in a saturation region. To write information '1' into the MTJ 302, the write voltage now needs to be applied at the SL, while the BL is now at a lower voltage (e.g., 0V). As such, the write current now flows from the controlled transistor 304 to the MTJ 302. Note that, for the write '0' operation, the MTJ 302 acts like a drain resistance of the controlled transistor 304, while for the write '1' operation, the MTJ 302 acts like a source resistance of the controlled transistor 304. This configuration change creates an asymmetry in the write current due to the source degeneration. For read-out of the MTJ 302, a read voltage, which is smaller than the write voltage, is applied at the BL, while the SL is at lower voltage (e.g., 0 V). As such, a read-out current flows from the MTJ 302 to the controlled transistor 304. The read-out is enabled using a current-sense amplifier (not shown) that senses the current change (e.g., change of the read-out current) in the controlled transistor 304 due to the magnetoresistance (MR) change between '0' and '1' states. Typically, the MTJ 302 has a baseline resistance smaller than 10 kΩ, and exhibits a MR change of 200% between '0' and '1' states (between antiparallel and parallel conditions of the magnetization direction of the free magnetic layer 306 and the magnetization direction of the fixed magnetic layer 308). Herein, the baseline resistance refers to a resistance of the MTJ 302.

Due to the high current density required to change a magnetization direction using STT, a large amount of power will be consumed by the MTJ 302. The large power requirement limits packaging density, and the high current density can cause reliability problems by breaking down the oxide layer 310. A problem with STT MRAM technology is that the write time for switching the magnetization direction is inversely related to the write current required to switch the device. In other words, to decrease the switching time (e.g., reduce write access latency), the write current must be increased. Thus, reducing the large write current (e.g., reducing the write voltage) to save power and/or increase density results in slower write access times.

Furthermore, in order to have a large write current at a reasonable write voltage applied to the MTJ 302, the MTJ 302 needs to have a relatively low baseline resistance (e.g., <10 kΩ). The smaller baseline resistance corresponds to the fact that the oxide layer 310 needs to be relatively thin (e.g. <1 nm). Usage of a thin oxide layer creates reliability issues, involving oxide breakdowns, pinholes, etc. In addition, to accommodate the large write current, the controlled transistor 304 needs to be a large transistor, which significantly limits the density scaling.

FIG. 4 provides a schematic diagram of a magnetic memory structure 400 including a resonant-exchange-controlled (REC) magnetic tunnel junction (MTJ) 402 as a bit storage unit and a controlled transistor 404 to select the bit. Unlike the MTJ 302 only having one oxide layer 310 between the free magnetic layer 306 and the fixed magnetic layer 308, the REC-MTJ 402 includes a resonant tunnel barrier 405 between a free magnetic layer 406 and a fixed magnetic layer 408. The resonant tunnel barrier 405 includes two oxide layers 410 and a spacer layer 412. The spacer layer 412 is disposed between the fixed magnetic layer 408 and the free magnetic layer 406. A first oxide layer 410-1 is disposed between the fixed magnetic layer 408 and the spacer layer 412, and a second oxide layer 410-2 is disposed between the spacer layer 412 and the free magnetic layer 406.

The REC-MTJ 402 is able to employ interlayer exchange coupling (IEC) between the free magnetic layer 406 and the fixed magnetic layer 408 to switch a direction of magnetization in the free magnetic layer 406 under the control of an applied electric field with a significantly lower current density than is required in the MTJ 302. The spacer layer 412 exhibits a large IEC while the oxide layers 410 provide tunnel barriers. The resonant tunnel barrier 405 (i.e., a combination of the spacer layer 412 and the oxide layers 410) forms a quantum-well (QW) between the free and fixed magnetic layers 406 and 408 with discrete energy states above the equilibrium Fermi level. When an electric field is applied in a direction across the REC-MTJ 402, the tunnel barriers become transparent to the wave functions of the magnetic layers 406 and 408 at the levels of the discrete energy states via a resonant tunneling phenomenon. This transparency allows the IEC between the fixed magnetic layer 408 and the free magnetic layer 406 to control the magnetization direction of the free magnetic layer 406 to be parallel or antiparallel to the magnetization direction of the fixed magnetic layer 408 depending on the magnitude of the applied electric field in the direction of the electric field. Different magnitudes of the electric field induce different signs (i.e., polarities) of IEC. Herein, a positive sign of IEC refers to a switching that will yield an antiparallel alignment, and a negative sign of IEC refers to a switching that will yield a parallel alignment. The IEC can be measured as an energy density in units of Joules per square meter. A magnitude of the IEC required to achieve magnetization switching is defined by a threshold value. The IEC threshold value is independent of a parameter describing a Gilbert damping and a parameter for indicating magnets having either in-plane or perpendicular anisotropies of the free magnetic layer, unlike existing MRAM technologies. The threshold value can be controlled by selection of materials, cross-sectional area, and thicknesses of the composite layer. However, the switching time of the magnetic memory structure herein can be optimized by the Gilbert damping and magnetic anisotropy.

Figure 5A:
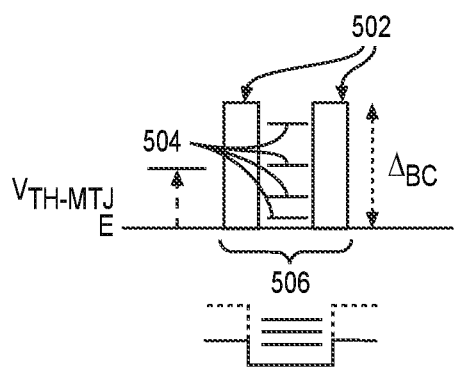

FIGS. 5A-5D provide detailed characteristics of the REC-MTJ 402 illustrated in FIG. 4. FIG. 5A illustrates barriers 502 created by the oxide layers 410 and discrete energy states 504 that are possible in a QW 506 formed in the resonant tunnel barrier 405 of the REC-MTJ 402. The discrete energy states 504 are above the Fermi level $E_F$. The QW 506 is formed in the resonant tunnel barrier 405 between the free and fixed magnetic layers 406 and 408 of the REC-MTJ 402. Below the equilibrium Fermi level $E_F$, majority/minority spin-dependent QWs with discrete energy levels exist within the spacer layer 412.

The oxide layers 410 create the barriers 502 having a height $\Delta_{BC}$ above the Fermi level $E_F$. The barriers 502 impede the flow of electrons across the spacer layer 412, forming the QW 716. However, due to resonant tunneling phenomena, a transmission coefficient across the oxide layers 410 is increased at the discrete energy states 504 to allow a stronger interaction between the wave functions of the free and fixed magnetic layers 406 and 408. A MTJ threshold voltage $V_{TH-MTJ}$ is a voltage required to achieve high transmission across the oxide layers 410 via the discrete energy states 504 within the QW 506, to induce an IEC strength greater than the switching threshold value. A magnitude or strength of the IEC depends on the wave function interaction at all quantum energy states in the QW 506, including those below the Fermi level $E_F$, and those above the Fermi level $E_F$ achieved by the application of the electric field based on a voltage $V_{REC-MTJ}$ applied across the REC-MTJ 402. The current density in the REC-MTJ 402 depends only on the quantum energy states in the QW 506, within the separation between two contact Fermi levels. Consequently, the current density flowing in the REC-MTJ 402 is much lower than in the MTJ 302 used in the STT technology, when a voltage or an electric field is applied to achieve an IEC strength greater than the switching threshold.

Figure 5B:
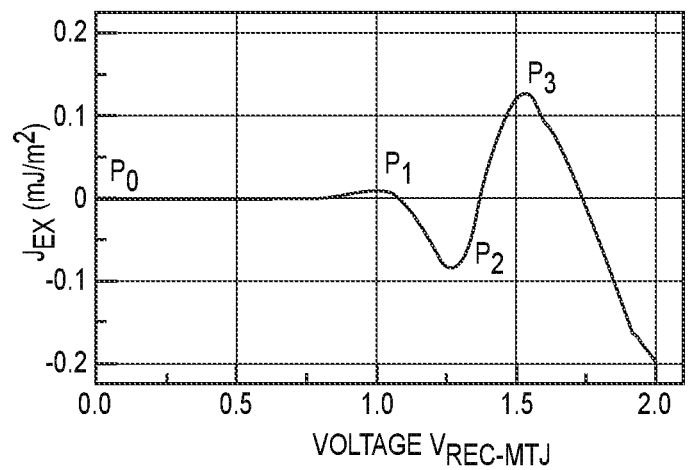

FIG. 5B illustrates the IEC (having a magnitude $J_{EX}$) in the resonant tunnel barrier 405 in FIG. 5A oscillating between positive and negative values and shows the IEC peaks increasing in magnitude with an increase in the electric field applied in a direction based on the voltage $V_{REC-MTJ}$. The IEC increases significantly when the voltage $V_{REC-MTJ}$ causes the electron energy within the QW 506 to achieve one of the energy states 504. The sign of the IEC changes polarity between peaks (i.e., at each energy state 504 reached due to the applied electric field). Therefore, the IEC oscillates between positive and negative values that increase in magnitude with an applied voltage $V_{REC-MTJ}$.

In the example in FIG. 5B, when the voltage $V_{REC-MTJ}$ is at $P_0$ level (e.g., 0 V), there is negligible transmission of electron wave functions across the oxide layers 410 of the REC-MTJ 402, the IEC is also negligible. When the voltage $V_{REC-MTJ}$ is raised to $P_1$ level (e.g., 1.0 V), a sizable positive IEC is achieved via energy states of the QW 506. With a positive IEC at the voltage level $P_1$, there should be an anti-ferromagnetic coupling between the free magnetic layer 406 and the fixed magnetic layer 408. However, magnetization switching does not occur in the REC-MTJ 402 until the magnitude of the IEC reaches a switching threshold, which is defined by a threshold value of an energy density of IEC. The switching threshold is attained by the voltage $V_{REC-MTJ}$. In other words, the magnitude of the IEC is below the switching threshold at the voltage of 1.0 volts at voltage level $P_1$, so the IEC is not strong enough to cause the direction of magnetization in the free magnetic layer 406 to be switched by the magnetization of the fixed magnetic layer 408.

As the voltage $V_{REC-MTJ}$ is increased from 1.0 V, the IEC magnitude initially decreases and then becomes an increasing negative value. When the voltage $V_{REC-MTJ}$ reaches 1.3 V at voltage level $P_2$, another IEC peak with negative polarity is achieved via energy states 504 of the QW 506. With a negative IEC, there should be a ferromagnetic coupling between the free magnetic layer 406 and the fixed magnetic layer 408. The magnitude of the IEC is above the switching threshold at voltage level $P_2$, and the IEC has a negative value, so ferromagnetic coupling causes the direction of magnetization of the free magnetic layer 406 to switch to become parallel to the direction of magnetization of the fixed magnetic layer 408, or causes the direction of magnetization of the free magnetic layer 406 to remain parallel to the direction of magnetization of the fixed magnetic layer 408 if already parallel.

When the voltage $V_{REC-MTJ}$ reaches 1.6 V at voltage level $P_3$, another IEC peak with positive polarity is achieved via energy states 504 of the QW 506. With a positive IEC, there should be an anti-ferromagnetic coupling between the free magnetic layer 504 and the fixed magnetic layer 506. At the voltage level $P_3$, with a positive IEC that is above the switching threshold, the direction of magnetization of the free magnetic layer 406 will switch to become antiparallel to the direction of the magnetization of the fixed magnetic layer 408 or the direction of magnetization of the free magnetic layer 406 will remain antiparallel to the direction of magnetization of the fixed magnetic layer 408 if already antiparallel.

Unlike magnetization switching by STT, employing voltage-controlled IEC to switch a magnetization direction of the free magnetic layer 406 in the REC-MTJ 402 does not require a change in the polarity of the applied voltage $V_{REC-MTJ}$. The switching does not depend on the polarity of the applied voltage $V_{REC-MTJ}$ but depends on the magnitude of the voltage $V_{REC-MTJ}$. This aspect is shown in the results of a simulation provided in FIG. 5C.

Figure 5C:
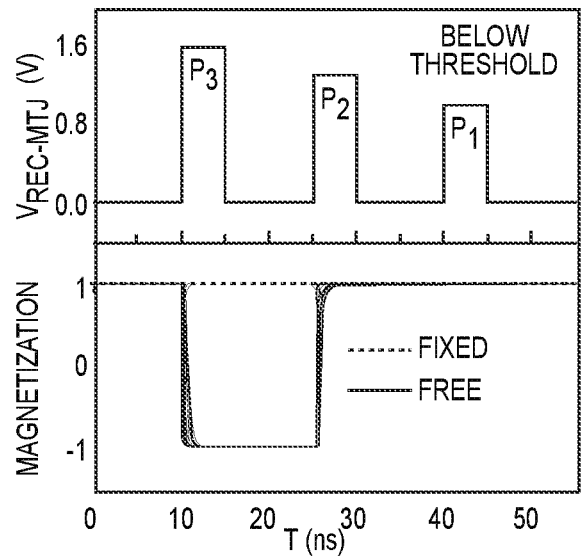

In the example in the simulation provided in FIG. 5C, the fixed magnetic layer 408 is formed of cobalt iron boron (CoFeB) having a thickness of 10 nm. The free magnetic layer 406 is formed of CoFeB having a thickness of 1 nm. The oxide layers 410 are formed of magnesium oxide (MgO) having a thickness of about 1 nm. The spacer layer 412 is formed of ruthenium (Ru) having a thickness of 0.8 nm. However, the REC-MTJ 402 disclosed herein is not limited to the materials and dimensions of the example of FIG. 5C. For example, the fixed magnetic layer 408 and the free magnetic layer 406 may each be formed from any one of iron (Fe), cobalt (Co), nickel (Ni), lanthanum strontium manganite (LSMO), CoFeB, CoFe, and the like. The fixed magnetic layer 408 may have a thickness in the range of 5 to 100 nm, and the free magnetic layer 406 may have a thickness in the range of 1 to 3 nm. The first and second oxide layers 410 may each be formed of any one of MgO, magnesium zinc oxide (MgZnO), aluminum monoxide (AlOx) (thermally grown), iron oxide ($Fe_2O_3$), titanium oxide ($TiO_2$), zinc oxide (ZnO), niobium oxide ($Nb_2O_5$), rhodium oxide ($Rh_2O_3$), tantalum oxide ($Ta_2O_3$), vanadium oxide ($V_2O_5$), aluminum oxide ($Al_2O_3$), and hafnium oxide ($HfO_2$). The first and second oxide layers 410 may each have a thickness in the range of 0.5 to 3 nm. The spacer layer 412 may be formed of any one of ruthenium (Ru), gold (Au), iridium (Ir), rhodium (Rh), copper (Cu), chromium (Cr), palladium (Pd), molybdenum (Mo), vanadium (V), tantalum (Ta), tungsten (W), platinum (Pt), nickel oxide (NiO), and iron silicon (FeSi). The spacer layer 412 may have a thickness in the range of 0.1 to 4 nm.

FIG. 5C illustrates a simulation of pulses of the voltage $V_{REC-MTJ}$ creating an electric field in a direction (e.g., through the resonant tunnel barrier 405) across the REC-MTJ 402. The voltage levels of the pulses in FIG. 5C correspond approximately with the voltage levels $P_3$, $P_2$, and $P_1$ shown in FIG. 5B. FIG. 5C also includes a corresponding graph of the magnetization directions of the free magnetic layer 406 and the fixed magnetic layer 408 over time T.

In the example in FIG. 5C, the simulation starts at time T=0 ns with the voltage $V_{REC-MTJ}$=0 V, at which there is negligible IEC in the resonant tunnel barrier 405, and an initial condition in which the directions of magnetization of the respective magnetic layers 406 and 408 are parallel to each other (e.g., both at magnetization of 1). The IEC is negligible at time 0 due to the barriers 502 created by the oxide layers 410 in FIG. 4. At the voltage $V_{REC-MTJ}$ of 0 V, the direction of magnetization of the free magnetic layer 406 will remain stable.

At time T=10 ns, the voltage $V_{REC-MTJ}$ is raised to 1.6 V, which corresponds to a positive IEC (anti-ferromagnetic) and the magnitude is above the switching threshold. After a minimum switching time $T_{IEC}$ (not shown), the IEC causes the direction of the magnetization of the free magnetic layer 406 to switch from being parallel to being antiparallel to the direction of magnetization of the fixed magnetic layer 408 (e.g., fixed magnetic layer at magnetization of 1, while free magnetic layer at magnetization of -1). After a certain time greater than the minimum switching time $T_{IEC}$, the voltage $V_{REC-MTJ}$ returns to 0 V, at which the direction of magnetization of the free magnetic layer 406 will remain stable until application of another voltage $V_{REC-MTJ}$ greater than the MTJ threshold voltage $V_{TH-MTJ}$.

At time T=25 ns, the voltage $V_{REC-MTJ}$ is raised to 1.3 V, which corresponds to a negative IEC (ferromagnetic) and the magnitude is above the switching threshold. After the minimum switching time $T_{IEC}$, the IEC causes the direction of the magnetization of the free magnetic layer 406 to switch back from being antiparallel to being parallel to the direction of the magnetization of the fixed magnetic layer 408 (e.g., both at magnetization of 1). After a certain time greater than the minimum switching time $T_{IEC}$, the voltage $V_{REC-MTJ}$ returns to 0 V, where the direction of magnetization of the free magnetic layer 406 will remain stable until application of another voltage $V_{REC-MTJ}$ greater than the MTJ threshold voltage $V_{TH-MTJ}$.

At time T=40 ns, the voltage $V_{REC-MTJ}$ is raised from 0 V to 1.0 V, which corresponds to a positive IEC (anti-ferromagnetic), but the magnitude of the IEC is below the switching threshold. Thus, the direction of magnetization of the free magnetic layer 406 remains unchanged (i.e., parallel to the direction of magnetization of the fixed magnetic layer 408). Herein, the REC-MTJ 402 is configured to switch the magnetization direction of the free magnetic layer 406 relative to the magnetization direction of the fixed magnetic layer 408 from antiparallel to parallel in response to the voltage $V_{REC-MTJ}$ at $P_3$ level, and from parallel to antiparallel in response to the voltage $V_{REC-MTJ}$ at $P_2$ level.

The voltage levels $P_2$ and $P_3$ are shown in FIG. 5C as square waves having instantaneous rise times and fall times. In practice, the rise times of the voltage $V_{REC-MTJ}$ should be approximately 10 ps and the fall times should be approximately 10 ps. The voltage $V_{REC-MTJ}$ corresponding to voltage level $P_3$ at a higher energy state 504 of the QW 506 should be reduced quickly to 0 V to avoid unintentionally changing the magnetization direction. For example, if the voltage $V_{REC-MTJ}$ is raised to 1.6 V to set the magnetization directions to be antiparallel, and the voltage $V_{REC-MTJ}$ then decreases slowly, such that the voltage $V_{REC-MTJ}$ is near 1.3 V for at least the minimum switching time $T_{IEC}$, the magnetization of the free layer 406 could unintentionally return to a parallel state (e.g., corresponding to voltage level $P_2$).

As discussed above, the magnetization direction of the free magnetic layer 406 may be switched by IEC in the presence of a voltage-controlled electric field corresponding to a discrete energy state 504 of the QW 506 formed by the resonant tunnel barrier 405. The pulses of the voltage $V_{REC-MTJ}$ illustrated in FIG. 5C provide an IEC with a magnitude above a switching threshold and a duration of at least a minimum switching time $T_{IEC}$ required for switching the magnetization direction.

For the REC-MTJ 402, the magnitude of the voltage $V_{REC-MTJ}$ decreases as the thickness of the spacer layer 412 is increased. Thus, in the REC-MTJ 402, the magnetization direction of the free magnetic layer 406 relative to the magnetization direction of the fixed magnetic layer 408 corresponds to the magnitude of the voltage $V_{REC-MTJ}$ between the fixed magnetic layer 408 and the free magnetic layer 406, and the magnitude of the voltage $V_{REC-MTJ}$ is inversely related to the thickness of the spacer layer 412. However, increasing the thickness of the spacer layer 412 increases the distance between the fixed magnetic layer 408 and the free magnetic layer 406; hence the IEC strength decreases.

In addition, the magnitudes of the voltage $V_{REC-MTJ}$ for observing the IEC peaks depend on a width of the QW 506, which corresponds to the thickness of the spacer layer 412. Specifically, the magnitudes of the voltage $V_{REC-MTJ}$ for observing the IEC peaks decrease with an increase in the width of the QW 506, and the magnitudes of the voltage $V_{REC-MTJ}$ for observing the IEC peaks are inversely related to the thickness of the spacer layer 412. Furthermore, the voltage $V_{REC-MTJ}$ required to maintain a particular magnitude of IEC increases with the height $\Delta_{BC}$ of the QW 506. That is, the magnitude of the IEC diminishes with an increase in height $\Delta_{BC}$ of the QW 506, even in the presence of a higher magnitude level of the voltage $V_{REC-MTJ}$.

The electrical resistance of the REC-MTJ 402 in the condition that the magnetization directions of the fixed and free magnetic layers 408 and 406 are antiparallel is higher than the electrical resistance of the REC-MTJ 402 in the condition that the magnetization directions of the fixed and free magnetic layers 408 and 406 are parallel. The parallel or antiparallel state represents a binary value, and binary data is written into the REC-MTJ 402 by setting the relative magnetization directions to be parallel or antiparallel.

Figure 5D:
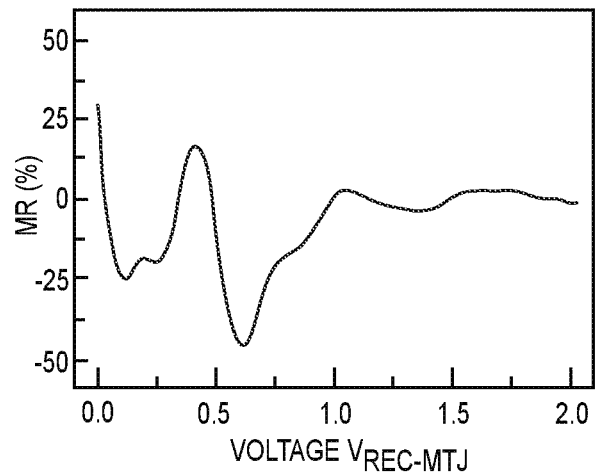

FIG. 5D illustrates MR of the REC-MTJ 402, which exhibits voltage-dependent oscillation due to the resonant tunneling. For the materials combination considered here (the fixed magnetic layer 408 formed of Co having a thickness of 10 nm, the free magnetic layer 406 formed of Co having a thickness of 1 nm, the oxide layers 410 formed of MgO having a thickness of about 1 nm, and the spacer layer 412 formed of Ru having a thickness of 0.8 nm). The REC-MTJ 402 exhibits a MR change about 20%-40% between '0' and '1' states (between antiparallel and parallel conditions of the magnetization direction of the free magnetic layer 406 and the magnetization direction of the fixed magnetic layer 408). Note that the MR is higher for a smaller operating voltage, which is in a read operating voltage region. IEC, however, is lower for a larger operating voltage, which is a write operating voltage region. Thus, the read and write operating voltage regions are decoupled.

Compared to the MTJ 302, the REC-MTJ 402 does not need a change in the voltage polarity across itself to achieve the '0' and '1' states, requires a lower current density (e.g., <$10^4$ A/cm2) for fast switching between the '0' and '1' states, and enables the read and write operating voltage regions to be well-separated.

The REC-MTJ 402 is connected in series with the controlled transistor 404 at a connection node $N_{CON}$. A gate of the controlled transistor 404 is connected to a WL, an open terminal of the REC-MTJ 402 (i.e., a terminal at the fixed magnetic layer 408) is connected to a BL, and an open terminal of the controlled transistor 404 (i.e., a terminal at a source of the controlled transistor 404) is connected to a SL. The voltage $V_{REC-MTJ}$ is a voltage between the BL and the connection node $N_{CON}$. In order to achieve low magnitudes of the voltage $V_{REC-MTJ}$ for observing the IEC peaks, the spacer layer 412 needs a relatively large thickness, and consequently has a very large baseline resistance >10 M. Herein, the baseline resistance refers to a resistance of the REC-MTJ 402. Notice that although the REC-MTJ 402 only exhibits an about 20-40% MR change, but the change is based on the very large baseline resistance >10 M. Therefore, the 20-40% MR change is still enough to produce a reasonable voltage change across the REC MTJ 402 and the controlled transistor 404 for read-out.

However, it is difficult to use a single transistor to select a bit, since most of the applied voltage drops across the high resistance REC-MTJ 402, and an unphysically large voltage is needed to drive the transistor to saturation.

FIG. 6 provides an exemplary magnetic memory structure 600 with a voltage-controlled gain-cell configuration and utilizing the REC-MTJ 402 according to one embodiment of the present disclosure. Besides the REC-MTJ 402, the magnetic memory structure 600 further includes a first transistor 602, a second transistor 604, and a resistor 606 (with a resistance Ro) to form a gain-cell configuration. Herein, the magnetic memory structure 600 is a new REC-MRAM with a voltage-controlled gain-cell configuration.

In detail, the REC-MTJ 402 with a large baseline resistance (e.g., >10 MΩ) is connected in series with the first transistor 602 at a connection node $N_{CON}$. A gate of the first transistor 602 is connected to a WL, an open terminal of the REC-MTJ 402 (i.e., a terminal at the fixed magnetic layer 408) is connected to a BL, and an open terminal of the first transistor 602 (i.e., a terminal at a source of the first transistor 602) is connected to a first SL1. A gate of the second transistor 604 is connected to the connection node $N_{CON}$. A drain of the second transistor 604 is connected to a bias voltage power with a voltage $V_{DD}$ via the resistor 606, and a source of the second transistor 604 is connected to a second SL2. An output voltage $V_{OUT}$ of the magnetic memory structure 600 is provided at the drain of the second transistor 604. The first and second transistors 604 and 606 can be implemented with any emerging transistor technologies with any semiconductor material, e.g., bulk complementary metal-oxide-semiconductor (CMOS), silicon-on-insulator (SOI) technologies, Fin field-effect transistors (FETs), negative-capacitance (NC) FETs, etc.

At the BL, a BL voltage $V_{BL}$ is provided to provide a power supply to the REC-MTJ 402 and the first transistor 604. A WL voltage $V_{WL}$ is applied at the WL to turn on the first transistor 602 to provide a gate voltage $V_X$ to the second transistor 604, if the WL voltage $V_{WL}$ is larger than a first threshold voltage $V_{TH1}$ of the first transistor 602. The bias voltage $V_{DD}$ and the resistor 606 are designed, such that the bias voltage $V_{DD}$ appears as the output voltage $V_{OUT}$ when the gate voltage $V_X$ is smaller than a second threshold voltage $V_{TH2}$ of the second transistor 604, and a voltage at the second SL2 appears as the output voltage $V_{OUT}$ when the gate voltage $V_X$ is larger than the second threshold voltage $V_{TH2}$ of the second transistor 604. In a non-limited example, the bias voltage $V_{DD}$=1 V, the resistor 606 is 100 kΩ, and the first and second SL1 and SL2 are connected to ground.

For a write operation, the WL voltage $V_{WL}$ is set such that conductance of the first transistor 602 increases and the majority of the BL voltage $V_{BL}$ drops across the REC-MTJ 402, and the gate voltage $V_X$ is very close to the voltage level of the first SL1. As such, the second transistor 604 is off during the write operation. The BL voltage $V_{BL}$ can be set to two different amplitudes (with a same polarity) so as to switch the free magnetic layer 406 and the fixed magnetic layer 408 of the REC-MTJ 402 to antiparallel and parallel conditions, and consequently achieve bidirectional switching. In a non-limited example, the WL voltage $V_{WL}$ is set to 1.2V, and the BL voltage $V_{BL}$ is set to 2 V and 1.6 V (the voltage $V_{REC-MTJ}$ across the REC-MTJ 402 is about 1.6 V and 1.3 V) for writing '1' and '0' operations (antiparallel and parallel conditions) respectively. Note that the current through the REC-MTJ 402 is very low during switching, and hence, the REC-MTJ 402 can be scaling down without the reliability issue. In addition, the first transistor 602 does not need to accommodate a large current and consequently does not need to be very large in size (different from the case in the STT-MRAM 300), which is attractive for further density scaling in MRAM technology.

On the other hand, for a read-operation, the WL voltage $V_{WL}$ is set such that the first transistor 602 is in a triode region and acts like a linear resistor. In this read-operation, the series connection of the REC-MTJ 402 and the first transistor 602 acts like a voltage divider. Therefore, the BL voltage $V_{BL}$ drops across REC-MTJ 402 and the first transistor 602 according to their resistances. The I-V characteristics of the first transistor 602 in the triode region is governed by:

$$I_1 \approx \mu_n C_{ox} \frac{W}{L}(V_{WL} - V_{TH1})V_{DS}$$

where $\mu_n$ is the mobility of the channel of the first transistor 602, $C_{ox}=\varepsilon_{ox}/t_{ox}$ is a gate capacitance per unit area of the first transistor 602, $\varepsilon_{ox}$ is the permittivity of the gate oxide, $t_{ox}$ is the thickness of the gate oxide, W is the width of the first transistor 602, L is the channel length of the first transistor 602, $V_{TH1}$ is the threshold voltage of the first transistor 602 and $V_{DS}$ is the voltage across the drain and source of the first transistor 602. The resistance of the first transistor 602 in the triode region is roughly given by $V_{DS}/I_1$. In order to make the resistance of the first transistor 602 comparable to the large baseline resistance of the REC-MTJ 402, a very low $$\mu_n C_{ox} \frac{W}{L}(V_{WL} - V_{TH1})$$

is needed.

For the read operation, in a non-limited example, the WL voltage $V_{WL}$ is set to 0.6 V. The BL voltage $V_{BL}$ is divided between the REC MTJ 402 and the first transistor 602, such that, at the connection node $N_{CON}$, the gate voltage $V_X<V_{TH2}$ (i.e., the threshold voltage of the second transistor 604) or $V_X>V_{TH2}$, when the REC-MTJ 402 corresponds to '1' state (antiparallel condition) or '0' state (parallel condition) respectively. It is because when the magnetization direction of the free magnetic layer 406 is parallel to the magnetization direction of the fixed magnetic layer 408, the resistance of the REC MTJ 402 will be relatively small, and the gate voltage $V_X$ will be relatively large (>$V_{TH2}$). When the magnetization direction of the free magnetic layer 406 is antiparallel to the magnetization direction of the fixed magnetic layer 408, the resistance of the REC MTJ 402 will be relatively large, and the gate voltage $V_X$ will be relatively small (<$V_{TH2}$). Thus, depending on the magnetization state (antiparallel condition or parallel condition), the second transistor 604 is either on or off with the output voltage $V_{OUT}$ about 0 V or $V_{DD}$, respectively. As such, an output current $I_2$ flowing through the second transistor 604 will significantly change. The read-out is enabled by sensing the current change of the output current $I_2$ to determine the '0' state or '1' state of the REC MTJ 402.

FIGS. 7A-7F provide operation simulations of the magnetic memory structure 600 illustrated in FIG. 6. In this example, 45 nm NMOS are used as transistors with W=150 nm and L=500 nm for the first transistor 602, and W=150 nm and L=45 nm for the second transistor 604, the resistance Ro of the resistor 606 is set to 100 kΩ, the bias voltage $V_{DD}$ is set to 1V, and the SL1 and SL2 are connected to ground. However, the operation of the magnetic memory structure 600 is not limited to these parameters and various other combinations are possible.

The operation simulation shown in FIGS. 7A-7F performs 5 operation steps within 25 ns, 5 ns for each operation step. The initial condition of the magnetization direction of the free magnetic layer 406 is parallel to the magnetization direction of the fixed magnetic layer 408 (magnetization M=1), and the REC MTJ 402 is at a '1' state. A read operation is applied in a first operation step (i.e., 0-5 ns), where the WL voltage $V_{WL}$=0.6V with 5 ns time width and the BL voltage $V_{BL}$=0.6V with 4.2 ns time width. Herein, the applied WL voltage $V_{WL}$ makes the first transistor 602 is in a triode region and acts like a linear resistor. As described above, when the REC-MTJ 402 corresponds to '1' state (i.e., at the parallel condition), the gate voltage $V_X$ for the second transistor 604 is smaller than the threshold voltage $V_{TH2}$. Therefore, the second transistor 604 is off, the output voltage $V_{OUT}$ is about $V_{DD}$ (about 1V in this example), and the output current $I_2$ is about 10 nA. This first operation step confirms that the magnets are parallel, and the storage magnet is '1'.

In a second operation step (i.e., 5-10 ns), a write '0' operation is performed, where the WL voltage $V_{WL}$=1.2 V with 5 ns time width and the BL voltage $V_{BL}$=2 V with 4.2 ns time width. A majority of the BL voltage $V_{BL}$ (about 1.6 V) drops across the REC-MTJ 402, and induces REC ($J_{EX}$>0), which switches the magnetization direction of the free magnetic layer 406 antiparallel to the magnetization direction of the fixed magnetic layer 408 (magnetization M=−1) and switches the REC MTJ 402 to a '0' state.

This write '0' operation is followed by another read operation in a third operation step (i.e., 10-15 ns), where the WL voltage $V_{WL}$=0.6V with 5 ns time width and the BL voltage $V_{BL}$=0.6V with 4.2 ns time width. Herein, the magnetization direction of the free magnetic layer 406 is antiparallel to the magnetization direction of the fixed magnetic layer 408 (magnetization M=−1), and the REC MTJ 402 is at a '0' state. As describe above, when the REC-MTJ 402 corresponds to '0' state, (i.e., at the antiparallel condition), the gate voltage $V_X$ for the second transistor 604 is larger than the threshold voltage $V_{TH2}$. Therefore, the second transistor 604 is turned on by the gate voltage $V_X$, the output voltage $V_{OUT}$ is about 0V, and the output current $I_2$ is about 10 μA. Note that the output current $I_2$ through the second transistor 604 changes at least $10^3$ times between the '0' and '1' states. Such a large separation of the two states is achieved by the magnetic memory structure 600 with this voltage-controlled gain-cell configuration.

Next, in a fourth operation step (i.e., 15-20 ns), a write '1' operation is performed using the WL voltage $V_{WL}=1.2$ V with 5 ns time width and the BL voltage $V_{BL}=1.6$ V with 4.2 ns time width, which switches the magnetization direction of the free magnetic layer 406 parallel to the magnetization direction of the fixed magnetic layer 408 (magnetization M=1) and switches the REC MTJ 402 to a '1' state.

Finally, the write '1' operation is followed by a third read operation in a fifth operation step (i.e., 20-25 ns), where the WL voltage $V_{WL}=0.6$V with 5 ns time width and the BL voltage $V_{BL}=0.6$V with 4.2 ns time width. Herein, the magnetization direction of the free magnetic layer 406 is parallel the magnetization direction of the fixed magnetic layer 408 (magnetization M=1), and the REC MTJ 402 is at a '1' state. Similar to the first read operation, the gate voltage $V_X$ for the second transistor 604 is smaller than the threshold voltage $V_{TH2}$. Therefore, the second transistor 604 is off, the output voltage $V_{OUT}$ is about $V_{DD}$ (about 1V in this example), and the output current $I_2$ is about 10 nA. This fifth operation step also confirms that the output current $I_2$ through the second transistor 604 changes at least $10^3$ times between the '0' and '1' states.

FIG. 8A illustrates comparisons of write energy consumption and write latency of the exemplary magnetic memory structure 600 (i.e., new REC-MRAM) and existing MRAM technologies. For non-volatile memory structures, the magnetic memory structure 600 with the REC MTJ 402 has a shortest write delay (about 1.2 ns) with a lowest write energy consumption (about 30 fJ). Compared to the volatile dynamic random access memory (DRAM), the magnetic memory structure 600 with the REC MTJ 402 has a shorter write delay and comparable write energy consumption. In addition, compared to the static random access memory (SRAM), the magnetic memory structure 600 with the REC MTJ 402 has a longer write delay and higher write energy, however, the SRAM is volatile and requires a large device area.

FIG. 8B illustrates comparisons of read energy consumption and read latency of the exemplary magnetic memory structure 600 (i.e., new REC-MRAM) and existing MRAM technologies. For non-volatile memory structures, the magnetic memory structure 600 with the REC MTJ 402 has a shortest read delay (about 0.6-1.1 ns) with a lowest write energy consumption (about 7-40 fJ). Compared to the volatile DRAM, the magnetic memory structure 600 with the REC MTJ 402 has a shorter read delay and lower read energy consumption. In addition, compared to the SRAM, the magnetic memory structure 600 with the REC MTJ 402 has a longer read delay and comparable read energy consumption, however, the SRAM is volatile and requires a large device area.

In summary, the non-volatile magnetic memory structure 600 exhibits attractive energy consumption and latency performances. In addition, in the magnetic memory structure 600, the REC MTJ 402 does not have reliability issues due to a thin oxide layer and is compatible with the small transistors due to low current density. Furthermore, the magnetic memory structure 600 offers a significant read-out current change between $10^3$ times and $10^9$ times (at least $10^3$ times change in this example) depending on the CMOS technology used. The smaller transistors and large-read margins are attractive for further density scaling. In the present disclosure, the magnetic memory structure 600 exhibits an efficient read-out scheme by utilizing the REC MTJ 402. However, the REC MTJ 402 can be replaced by any one two-terminal memory resistive device, which has a large baseline resistance (e.g., >10 MΩ), requires voltage pulses (with same polarity) to switch between two memory state (e.g., between the parallel state and the antiparallel state, or between the '1' state and the '0' state), and exhibits a resistance change between the two memory states.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A magnetic memory structure, comprising:
   a two-terminal memory resistive device with a first terminal connected to a bit line (BL), wherein:
      the memory resistive device has a baseline resistance larger than 10 MΩ; and
      the memory resistive device is eligible to exhibit a '1' state and a '0' state, and exhibit a resistance change between the '1' state and the '0' state;
   a first transistor connected in series between a second terminal of the memory resistive device and a first source line (SL); and
   a second transistor having a gate connected to the second terminal of the memory resistive device, a drain connected to a bias voltage power, and a source connected to a second SL, wherein:
      when the memory resistive device exhibits the '1' state, a gate voltage at the gate of the second transistor is smaller than a threshold voltage of the second transistor; and
      when the memory resistive device exhibits the '0' state, the gate voltage at the gate of the second transistor is larger than the threshold voltage of the second transistor.

2. The magnetic memory structure of claim 1, the memory resistive device is configured to switch between the '1' state and a '0' state by applying voltage pulses, which have different amplitudes with a same polarity.

3. The magnetic memory structure of claim 1, wherein corresponding to the '0' state and the '1' state, a current flowing through the second transistor changes between $10^3$ times and $10^9$ times in amplitude.

4. The magnetic memory structure of claim 1, wherein the first SL and the second SL are connected to ground.

5. The magnetic memory structure of claim 1 further comprising a resistor, which is connected in series between the drain of the second transistor and the bias voltage power.

6. The magnetic memory structure of claim 1, wherein each of the first transistor and the second transistor is implemented with one of bulk complementary metal-oxide-semiconductor (CMOS), silicon-on-insulator (SOI) technologies, Fin field-effect transistors (FETs), and negative-capacitance (NC) FETs.

7. The magnetic memory structure of claim 1, wherein a magnetoresistance (MR) change of the memory resistive device is between 20%-40% between the '0' state and the '1' state.

8. The magnetic memory structure of claim 1, wherein the memory resistive device is a resonant-exchange-controlled (REC) magnetic tunnel junction (MTJ), and comprises:
a fixed magnetic layer;
a free magnetic layer; and
a resonant tunnel barrier disposed between the fixed magnetic layer and the free magnetic layer, wherein:
when the memory resistive device exhibits the '1' state, a magnetization direction of the free magnetic layer relative to a magnetization direction of the fixed magnetic layer is parallel; and
when the memory resistive device exhibits the '0' state, a magnetization direction of the free magnetic layer relative to a magnetization direction of the fixed magnetic layer is antiparallel.

9. The magnetic memory structure of claim 8, wherein:
the magnetization direction of the free magnetic layer relative to the magnetization direction of the fixed magnetic layer is parallel in response to a first BL voltage applied to the BL;
the magnetization direction of the free magnetic layer relative to a magnetization direction of the fixed magnetic layer is antiparallel in response to a second BL voltage applied to the BL; and
the first BL voltage and the second BL voltage have different amplitudes and a same polarity.

10. The magnetic memory structure of claim 9, wherein the first BL voltage and the second BL voltage change interlayer exchange coupling (IEC) between the fixed magnetic layer and the free magnetic layer of the REC MTJ above a threshold, at which the magnetization direction of the free magnetic layer is determined by the magnetization direction of the fixed magnetic layer.

11. The magnetic memory structure of claim 8, wherein the fixed magnetic layer and the free magnetic layer each comprises one of iron (Fe), cobalt (Co), nickel (Ni), lanthanum strontium manganite (LSMO), cobalt iron boron (CoFeB), and cobalt iron (CoFe).

12. The magnetic memory structure of claim 11, wherein the fixed magnetic layer has a thickness in a range of 5 nm to 100 nm, and the free magnetic layer has a thickness in a range of 1 nm to 3 nm.

13. The magnetic memory structure of claim 8, wherein the resonant tunnel barrier comprises:
a spacer layer disposed between the fixed magnetic layer and the free magnetic layer;
a first oxide layer disposed between the fixed magnetic layer and the spacer layer; and
a second oxide layer disposed between the spacer layer and the free magnetic layer.

14. The magnetic memory structure of claim 13, wherein:
the spacer layer comprises one of ruthenium (Ru), gold (Au), iridium (Ir), rhodium (Rh), copper (Cu), chromium (Cr), palladium (Pd), molybdenum (Mo), vanadium (V), tantalum (Ta), tungsten (W), platinum (Pt), nickel oxide (NiO), and iron silicon (FeSi); and
the first oxide layer and the second oxide layer each comprise one of magnesium oxide (MgO), magnesium zinc oxide (MgZnO), aluminum monoxide (AlOx), iron oxide ($Fe_2O_3$), titanium oxide ($TiO_2$), zinc oxide (ZnO), niobium oxide ($Nb_2O_5$), rhodium oxide ($Rh_2O_3$), tantalum oxide ($Ta_2O_5$), vanadium oxide ($V_2O_5$), aluminum oxide ($Al_2O_3$), and hafnium oxide ($HfO_2$).

15. The magnetic memory structure of claim 14, wherein the first oxide layer and the second oxide layer each has a thickness in a range of 0.5 nm to 3 nm, and the spacer layer has a thickness in a range of 0.1 nm to 4 nm.

16. The magnetic memory structure of claim 1, wherein the memory resistive device is a resonant-exchange-controlled (REC) magnetic tunnel junction (MTJ), and comprises:
a fixed magnetic layer;
a free magnetic layer; and
a resonant tunnel barrier providing a quantum well between the fixed magnetic layer and the free magnetic layer, wherein:
when the memory resistive device exhibits the '1' state, an interlayer exchange coupling (IEC) in the resonant tunnel barrier achieves a first IEC peak;
when the memory resistive device exhibits the '0' state, the IEC in the resonant tunnel barrier achieves a second IEC peak; and
the first IEC peak and the second IEC peak have different polarities.

17. The magnetic memory structure of claim 16, wherein:
the first IEC peak is achieved in response to a first BL voltage applied to the BL;
the second IEC peak is achieved in response to a second BL voltage applied to the BL; and
the first BL voltage and the second BL voltage have different amplitudes and a same polarity.

18. The magnetic memory structure of claim 16, wherein the resonant tunnel barrier comprises:
a spacer layer disposed between the fixed magnetic layer and the free magnetic layer;
a first oxide layer disposed between the fixed magnetic layer and the spacer layer; and
a second oxide layer disposed between the spacer layer and the free magnetic layer.

19. The magnetic memory structure of claim 18, wherein:
the spacer layer comprises one of ruthenium (Ru), gold (Au), iridium (Ir), rhodium (Rh), copper (Cu), chromium (Cr), palladium (Pd), molybdenum (Mo), vanadium (V), tantalum (Ta), tungsten (W), platinum (Pt), nickel oxide (NiO), and iron silicon (FeSi); and
the first oxide layer and the second oxide layer each comprise one of magnesium oxide (MgO), magnesium zinc oxide (MgZnO), aluminum monoxide (AlOx), iron oxide ($Fe_2O_3$), titanium oxide ($TiO_2$), zinc oxide (ZnO), niobium oxide ($Nb_2O_5$), rhodium oxide ($Rh_2O_3$), tantalum oxide ($Ta_2O_5$), vanadium oxide ($V_2O_5$), aluminum oxide ($Al_2O_3$), and hafnium oxide ($HfO_2$).

20. The magnetic memory structure of claim 19, wherein the first oxide layer and the second oxide layer each has a thickness in a range of 0.5 nm to 3 nm, and the spacer layer has a thickness in a range of 0.1 nm to 4 nm.

* * * * *